(12) United States Patent
Lau et al.

(10) Patent No.: US 11,562,972 B2
(45) Date of Patent: Jan. 24, 2023

(54) MANUFACTURING METHOD OF THE CHIP PACKAGE STRUCTURE HAVING AT LEAST ONE CHIP AND AT LEAST ONE THERMALLY CONDUCTIVE ELEMENT

(71) Applicant: Unimicron Technology Corp., Taoyuan (TW)

(72) Inventors: John Hon-Shing Lau, Taoyuan (TW); Yu-Chi Shen, Hsinchu (TW); Tzyy-Jang Tseng, Taoyuan (TW); Chen-Hua Cheng, Taoyuan (TW); Pei-Wei Wang, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 29 days.

(21) Appl. No.: 17/463,559

(22) Filed: Sep. 1, 2021

(65) Prior Publication Data
US 2021/0398925 A1  Dec. 23, 2021

Related U.S. Application Data

(62) Division of application No. 16/729,488, filed on Dec. 30, 2019, now Pat. No. 11,145,610.

(51) Int. Cl.
*H01L 21/56* (2006.01)
*H01L 23/66* (2006.01)
(Continued)

(52) U.S. Cl.
CPC ............ *H01L 23/66* (2013.01); *H01L 21/563* (2013.01); *H01L 23/3114* (2013.01); *H01L 24/11* (2013.01); *H01L 24/13* (2013.01); *H01L 24/27* (2013.01); *H01L 24/29* (2013.01); *H01Q 1/2283* (2013.01); *H01L 2223/6677* (2013.01)

(58) Field of Classification Search
CPC ..... H01L 21/56; H01L 21/563; H01L 21/568; H01L 23/66; H01L 23/3114; H01L 23/3128; H01L 23/49816; H01L 23/3677; H01L 23/5289; H01L 24/13; H01L 24/19; H01L 24/20; H01L 24/27; H01L 24/29; (Continued)

(56) References Cited

U.S. PATENT DOCUMENTS 10,170,341 B1 * 1/2019 Lin ..................... H01L 21/4853
10,354,964 B2 * 7/2019 Yu ....................... H01L 23/3114
(Continued)

*Primary Examiner* — Khiem D Nguyen
(74) *Attorney, Agent, or Firm* — JCIPRNET

(57) ABSTRACT

A chip package structure includes at least one chip, at least one thermally conductive element, a molding compound, and a redistribution layer. The respective chip has an active surface and a back surface opposite to each other and a plurality of electrodes disposed on the active surface. The thermally conductive element is disposed on the back surface of the respective chip. The molding compound encapsulates the chip and the thermally conductive element and has an upper surface and a lower surface opposite to each other. A bottom surface of each of the electrodes of the respective chip is aligned with the lower surface of the molding compound. The molding compound exposes a top surface of the respective thermally conductive element. The redistribution layer is disposed on the lower surface of the molding compound and electrically connected to the electrodes of the respective chip.

10 Claims, 8 Drawing Sheets

(51) Int. Cl.
*H01L 23/31* (2006.01)
*H01L 23/00* (2006.01)
*H01Q 1/22* (2006.01)

(58) Field of Classification Search
CPC ............ H01L 24/73; H01L 2223/6677; H01Q 1/2283; H01Q 21/065; H01Q 21/062
USPC ........................................................ 257/728
See application file for complete search history.

(56) References Cited

U.S. PATENT DOCUMENTS

| 2014/0077394 A1* | 3/2014 | Chang ................ H01L 23/4334 |
| | | 257/782 |
| 2019/0181085 A1* | 6/2019 | Chen ..................... H01L 21/568 |
| 2020/0135670 A1* | 4/2020 | Hsu ......................... H01L 24/20 |

* cited by examiner

US 11,562,972 B2

MANUFACTURING METHOD OF THE CHIP PACKAGE STRUCTURE HAVING AT LEAST ONE CHIP AND AT LEAST ONE THERMALLY CONDUCTIVE ELEMENT

CROSS-REFERENCE TO RELATED APPLICATION

This application is a divisional application of the U.S. application Ser. No. 16/729,488, filed on Dec. 30, 2019, now issued as U.S. Pat. No. 11,145,610. The entirety of the above mentioned patent application is hereby incorporated by reference herein and made a part of this specification.

BACKGROUND OF THE INVENTION

Field of the Invention

The invention relates to a package structure and a manufacturing method thereof, and in particular to a chip package structure and a manufacturing method thereof.

Description of Related Art

The use of a fan-out multi-band antenna wafer-level package design may miniaturize electronic circuits and significantly reduce electrical insertion loss. In the future, as electronic products become faster and faster in transmission frequency and operating speed, the accompanying heat dissipation issue of chips will become more and more important. However, in the manufacture of the fan-out multi-band antenna wafer-level package, the active surface of the chip is faced up and back-bonded to a first redistribution layer used as the antenna ground pattern, and then a second redistribution layer electrically connected to solder balls is formed on the active surface of the chip. Therefore, a heat sink or a cooling fin may not be added to the manufacturing method to dissipate heat from the chip, and as a result the heat dissipation issue of the fan-out multi-band antenna wafer-level package may not be solved.

SUMMARY OF THE INVENTION

The invention provides a chip package structure having better heat dissipation effect.

The invention provides a manufacturing method of a chip package structure used for manufacturing the above chip package structure.

A chip package structure of the invention includes at least one chip, at least one thermally conductive element, a molding compound, and a redistribution layer. The respective chip has an active surface and a back surface opposite to each other and a plurality of electrodes disposed on the active surface. The thermally conductive element is disposed on the back surface of the respective chip. The molding compound encapsulates the chip and the thermally conductive element and has an upper surface and a lower surface opposite to each other. A bottom surface of each of the electrodes of the respective chip is aligned with the lower surface of the molding compound. The molding compound exposes a top surface of the respective thermally conductive element. The redistribution layer is disposed on the lower surface of the molding compound and electrically connected to the electrodes of the respective chip.

In an embodiment of the invention, the chip package structure further includes at least one conductive through hole, at least one first pad, and at least one second pad. The conductive through hole penetrates the molding compound and is connected to the upper surface and the lower surface. The first pad is disposed on the upper surface of the molding compound and electrically connected to a first end of the respective conductive through hole. The second pad is disposed on the lower surface of the molding compound and electrically connected to a second end of the respective conductive through hole, wherein the redistribution layer is electrically connected to the second pad.

In an embodiment of the invention, the chip package structure further includes an antenna structure layer disposed on the upper surface of the molding compound and includes a dielectric layer and a plurality of antenna patterns. The dielectric layer has at least one opening exposing the thermally conductive element, and the dielectric layer covers the upper surface of the molding compound and the first pad. The antenna patterns are embedded in the dielectric layer and aligned with a surface of the dielectric layer that is relatively far from the molding compound. The antenna patterns are electrically connected to the first pad.

In an embodiment of the invention, the at least one chip is at least one radio frequency chip.

In an embodiment of the invention, the at least one chip includes a first chip and a second chip. The antenna patterns are disposed corresponding to the first chip.

In an embodiment of the invention, the first chip is a radio frequency chip, and the second chip is a baseband chip.

In an embodiment of the invention, the at least one chip is at least one baseband chip.

In an embodiment of the invention, the chip package structure further includes a plurality of solder balls disposed on a plurality of fan-out pads of the redistribution layer and electrically connected to the redistribution layer.

In an embodiment of the invention, an orthographic projection area of the respective thermally conductive element on the back surface of the respective chip is smaller than an area of the back surface.

In an embodiment of the invention, the chip package structure further includes at least one thermal interface material disposed between the thermally conductive element and the chip. The thermally conductive element is fixed on the chip via the thermal interface material.

A manufacturing method of a chip package structure of the invention includes the following steps. A carrier with an adhesive layer formed is provided. At least one chip and at least one thermally conductive element are provided. The respective chip has an active surface and a back surface opposite to each other and a plurality of electrodes disposed on the active surface. The respective thermally conductive element is disposed on the back surface of the respective chip. The chip is bonded to the carrier, wherein the electrodes of the respective chip are directly in contact with the adhesive layer. A molding compound is formed on the carrier to cover the adhesive layer and encapsulate the chip and the thermally conductive element. A portion of the molding compound is removed such that the molding compound exposes a top surface of the respective thermally conductive element. The carrier and the adhesive layer are removed to expose the electrodes of the respective chip and a lower surface of the molding compound. A bottom surface of each of the electrodes of the respective chip is aligned with the lower surface of the molding compound. A redistribution layer is formed on the lower surface of the molding compound. The redistribution layer is electrically connected to the electrodes of the respective chip.

In an embodiment of the invention, after the carrier and the adhesive layer are removed and before the redistribution layer is formed, the method further includes the following steps. At least one conductive through hole is formed to penetrate the molding compound and connect an upper surface of the molding compound opposite to the lower surface and the lower surface. At least one first pad is formed on the upper surface of the molding compound, wherein the first pad is electrically connected to a first end of the respective conductive through hole. At least one second pad is formed on the lower surface of the molding compound, wherein the second pad is electrically connected to a second end of the respective conductive through hole.

In an embodiment of the invention, before the redistribution layer is formed, the method further includes forming an antenna structure layer on the upper surface of the molding compound. The antenna structure layer includes a dielectric layer and a plurality of antenna patterns. The dielectric layer has at least one opening exposing the thermally conductive element, and the dielectric layer covers the upper surface of the molding compound and the first pad. The antenna patterns are embedded in the dielectric layer and aligned with a surface of the dielectric layer that is relatively far from the molding compound. The antenna patterns are electrically connected to the first pad.

In an embodiment of the invention, the at least one chip is at least one radio frequency chip.

In an embodiment of the invention, the at least one chip includes a first chip and a second chip. The antenna patterns are disposed corresponding to the first chip.

In an embodiment of the invention, the first chip is a radio frequency chip, and the second chip is a baseband chip.

In an embodiment of the invention, the at least one chip is at least one baseband chip.

In an embodiment of the invention, after the redistribution layer is formed, the method further includes forming a plurality of solder balls on a plurality of fan-out pads of the redistributed layer, wherein the solder balls are electrically connected to the redistribution layer.

In an embodiment of the invention, an orthographic projection area of the respective thermally conductive element on the back surface of the respective chip is smaller than an area of the back surface.

In an embodiment of the invention, the manufacturing method of the chip package structure further includes providing at least one thermal interface material between the thermally conductive element and the chip, wherein the thermally conductive element is fixed on the chip via the thermal interface material.

Based on the above, in the design of the chip package structure of the invention, the thermally conductive element is disposed on the back surface of the chip, and the top surface of the thermally conductive element is exposed by the molding compound. Therefore, the heat generated by the chip may be quickly transferred to the outside via the thermally conductive element, so that the chip package structure of the invention may have a better heat dissipation effect. In addition, the redistribution layer is disposed on the lower surface of the molding compound and is electrically connected to the electrodes of the chip, so that the chip package structure of the invention may have better electrical performance. In short, the chip package structure of the invention may simultaneously have good electrical performance and heat dissipation performance, so that the function of the chip may be maintained normally without overheating, thereby effectively extending the service life of the chip package structure.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1J show cross-sectional views of a manufacturing method of a chip package structure of an embodiment of the invention. FIG. 2 shows a top view of the chip package structure of FIG. 1J. Regarding the manufacturing method of the chip package structure of the present embodiment, first refer to FIG. 1A in which a carrier 10 with an adhesive layer 12 formed is provided. Herein, the adhesive layer 12 is, for example, a double-sided thermal release tape, but is not limited thereto.

Figure 1A:
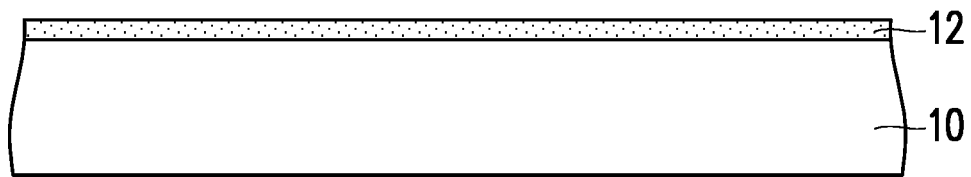
FIG. 1A to FIG. 1J show cross-sectional views of a manufacturing method of a chip package structure of an embodiment of the invention.
Figure 1B:
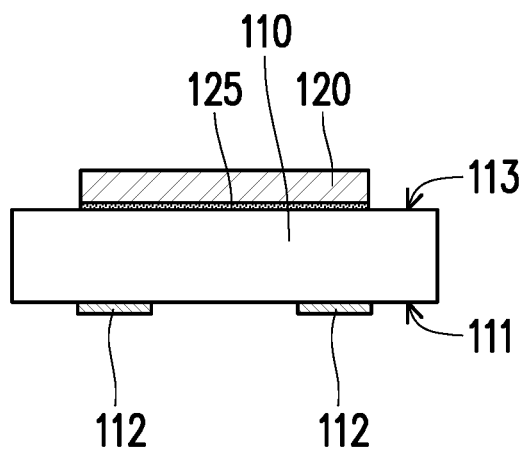
Figure 2:
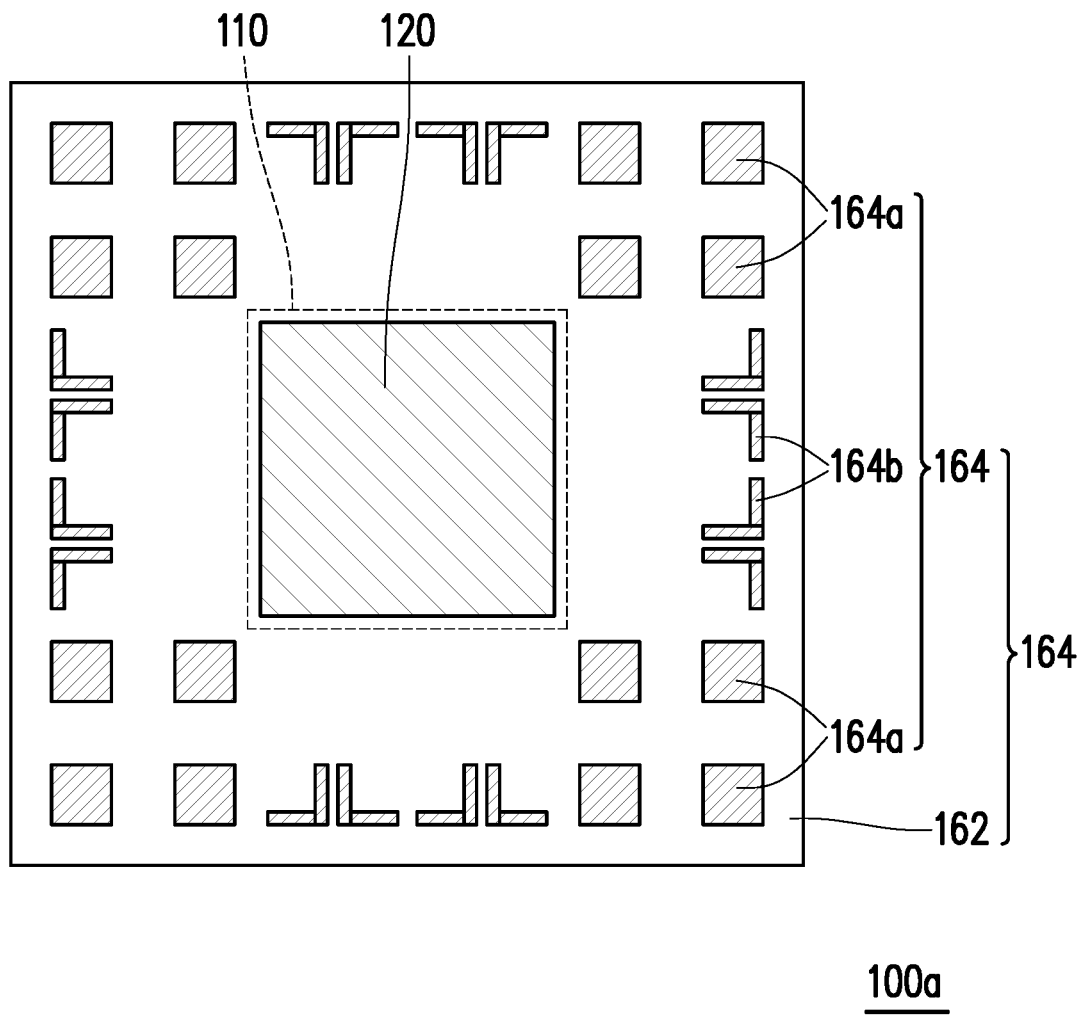
FIG. 2 shows a top view of the chip package structure of FIG. 1J.

Next, referring to FIG. 1B, at least one chip (one chip 110 is schematically shown) and at least one thermally conductive element (one thermally conductive element 120 is schematically shown) are provided. The chip 110 has an active surface 111 and a back surface 113 opposite to each other and a plurality of electrodes 112 disposed on the active surface 111. The thermally conductive element 120 is disposed on the back surface 113 of the chip 110. Furthermore, at least one thermal interface material (TIM) (one thermal interface material 125 is schematically shown) may be provided between the thermally conductive element 120 and the chip 110, wherein the thermally conductive element 120 may be fixed on the chip 110 via the thermal interface material 125. As shown in FIG. 1B, an orthographic projection area of the thermally conductive element 120 on the back surface 113 of the chip 110 is smaller than the area of the back surface 113. Herein, the chip 110 is embodied as a radio frequency (RF) chip, and the thermally conductive element 120 is, for example, a heat spreader, but is not limited thereto.

Figure 1C:
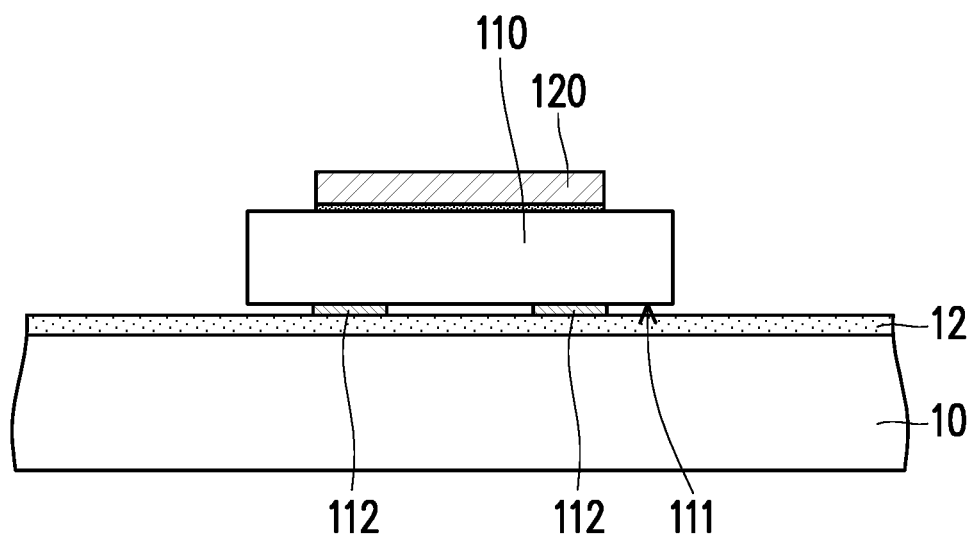

Next, referring to FIG. 1C, the chip 110 is bonded on the carrier 10, wherein the electrodes 112 of the chip 110 are directly in contact with the adhesive layer 12. Herein, the chip 110 and the thermally conductive element 120 thereon are bonded on the adhesive layer 12 of the carrier 10 with the active surface 111 faced down.

Figure 1D:
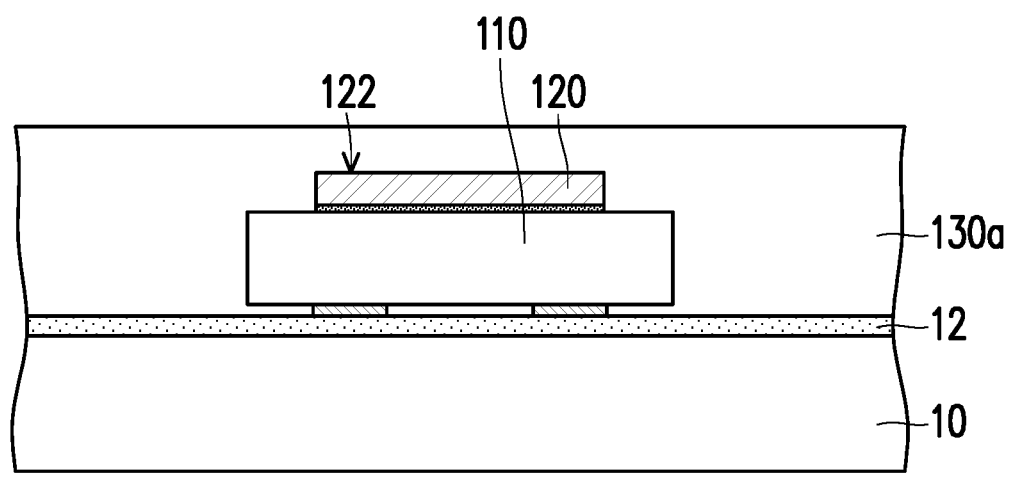

Next, referring to FIG. 1D, a molding compound 130a is formed on the carrier 10 to cover the adhesive layer 12 and encapsulate the chip 110 and the thermally conductive element 120. At this time, the molding compound 130a completely encapsulates the chip 110 and the thermally conductive element 120. That is, a top surface 122 of the thermally conductive element 120 is also covered by the molding compound 130.

Figure 1E:
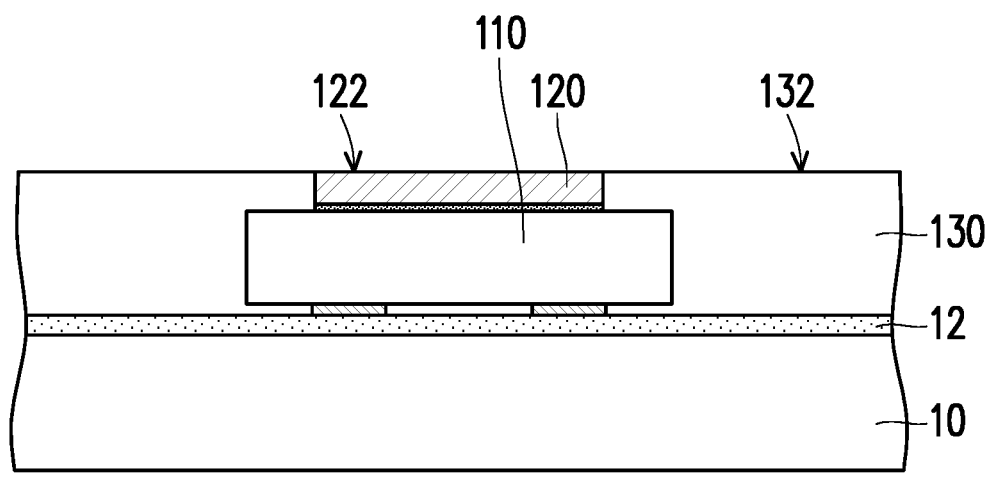

Next, referring to FIG. 1D and FIG. 1E at the same time, a portion of the molding compound 130a is removed by, for example, grinding, so that the molding compound 130 exposes the top surface 122 of the thermally conductive element 120. Herein, the top surface 122 of the thermally conductive element 120 is substantially aligned with an upper surface 132 of the molding compound 130.

Figure 1F:
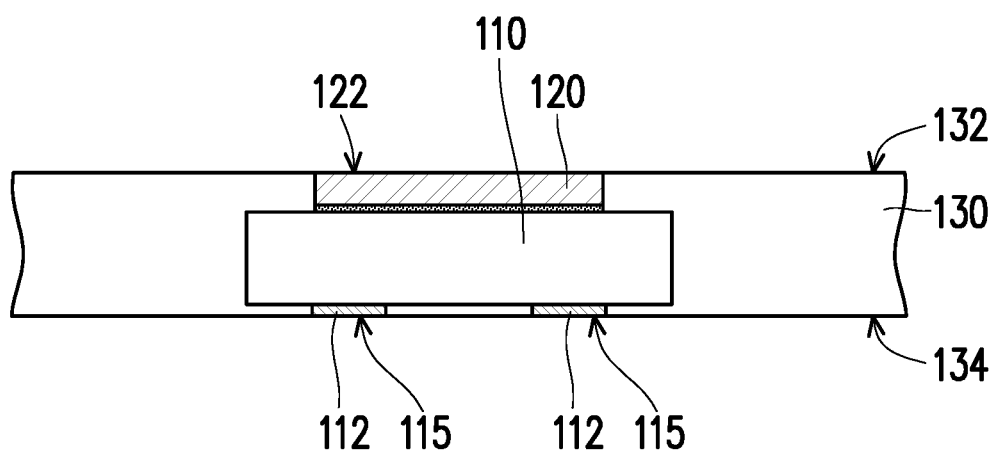

Next, referring to FIG. 1E and FIG. 1F at the same time, the carrier 10 and the adhesive layer 12 are removed, and the electrodes 112 of the chip 110 and a lower surface 134 of the molding compound 130 opposite to the upper surface 132 are exposed. Herein, a bottom surface 115 of each of the electrodes 112 of the chip 110 is substantially aligned with the lower surface 134 of the molding compound 130.

Figure 1G:
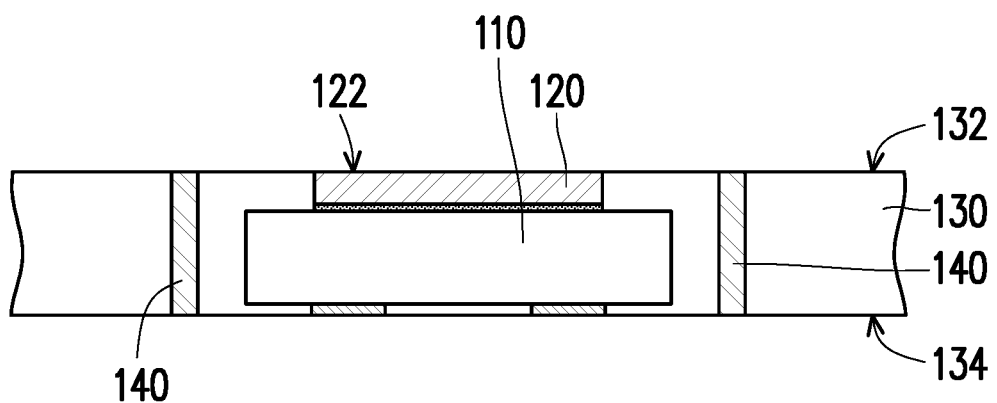
Figure 1H:
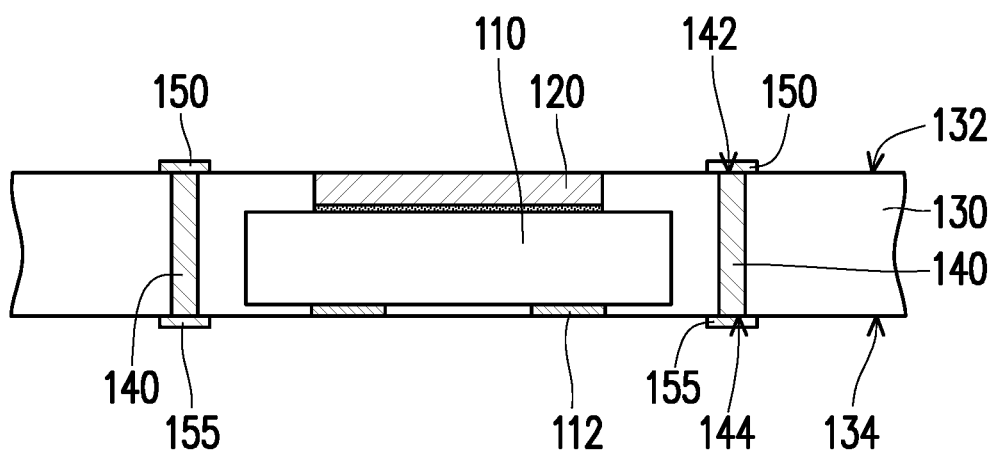

Next, please refer to FIG. 1G and FIG. 1H at the same time. Through holes are formed in the molding compound 130 via, for example, laser drilling. Via electroplating hole filling, at least one conductive through hole (two conductive through holes 140 are schematically shown) is formed to penetrate the molding compound 130, at least one first pad (two first pads 150 are schematically shown) is formed on the upper surface 132 of the molding compound 130, and at least one second pad (two second pads 155 are schematically shown) is formed on the lower surface 134 of the molding compound 130. The conductive through holes 140 are connected to the upper surface 132 and the lower surface 134, the first pads 150 are electrically connected to a first end 142 of each of the conductive through holes 140, and the second pads 155 are electrically connected to a second end 144 of each of the conductive through holes 140. Herein, the material of the conductive through holes 140, the material of the first pads 150, and the material of the second pads 155 are the same, and are, for example, copper, but not limited thereto.

Figure 1I:
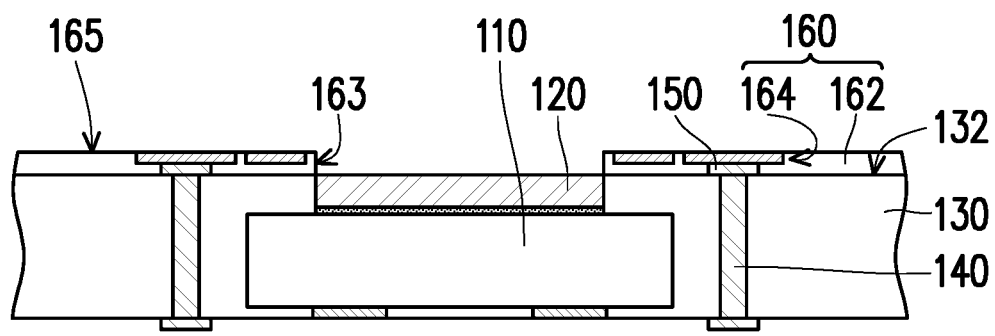

Next, please refer to FIG. 1I and FIG. 2 at the same time, an antenna structure layer 160 is formed on the upper surface 132 of the molding compound 130. The antenna structure layer 160 includes a dielectric layer 162 and a plurality of antenna patterns 164. The dielectric layer 162 has at least one opening (one opening 163 is schematically shown) exposing the thermally conductive element 120, and the dielectric layer 162 covers the upper surface 132 of the molding compound 130 and the first pads 150. Herein, the dielectric layer 162 is, for example, a photo-imageable dielectric layer, and the opening 163 is formed by, for example, etching, but the invention is not limited thereto. The antenna patterns 164 are embedded in the dielectric layer 162 and aligned with a surface 165 of the dielectric layer 162 that is relatively far from the molding compound 130, wherein the antenna patterns 164 are electrically connected to the first pads 150. Herein, the antenna patterns 164 include, for example, a plurality of patch antennas 164a and a plurality of dipole antennas 164b, and the material of the antenna patterns 164 is, for example, copper, but is not limited thereto.

Figure 1J:
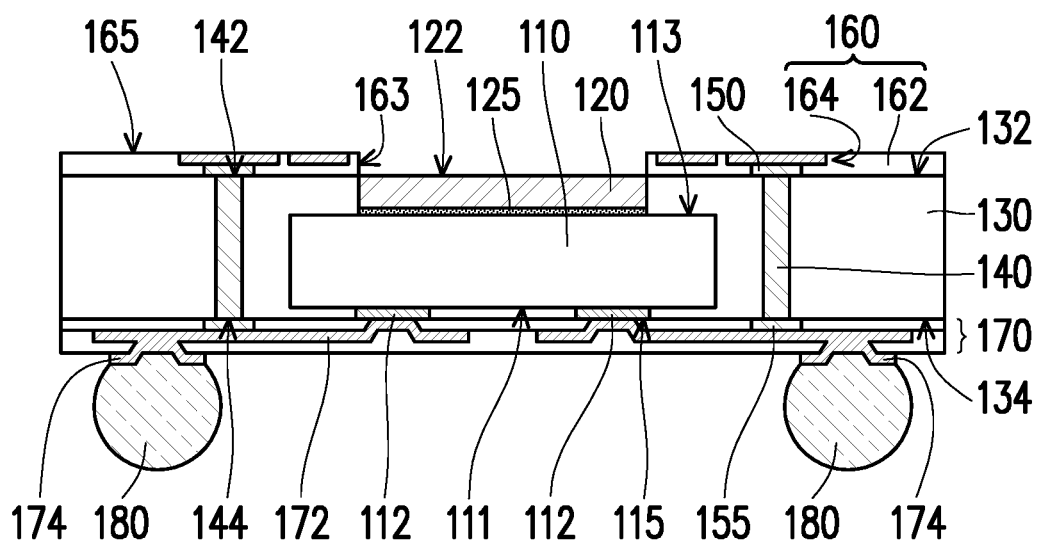

Lastly, referring to FIG. 1J, a redistribution layer 170 is formed on the lower surface 134 of the molding compound 130, wherein the redistribution layer 170 is electrically connected to the electrodes 112 of the chip 110. Since an orthographic projection area of a patterned circuit 172 of the redistribution layer 170 on the molding compound 130 is greater than an orthographic projection area of the chip 110 on the molding compound 130, the patterned circuit 172 may be regarded as a fan-out circuit. Next, a plurality of solder balls 180 are formed on a plurality of fan-out pads 174 of the redistribution layer 170, wherein the solder balls 180 are electrically connected to the redistribution layer 170. Lastly, at least one chip package structure 100a as shown in FIG. 1J may be formed via a singulation process to complete the manufacture of the chip package structure 100a.

Structurally, referring further to FIG. 1J, the chip package structure 100a of the present embodiment includes the chip 110, the thermally conductive element 120, the molding compound 130, and the redistribution layer 170. The chip 110 is, for example, a radio frequency chip, and has the active surface 111 and the back surface 113 opposite to each other and the electrodes 112 disposed on the active surface 111. The thermally conductive element 120 may be disposed and fixed on the back surface 113 of the chip 110 via the thermal interface material 125, wherein the orthographic projection area of the thermally conductive element 120 on the back surface 113 of the chip 110 is smaller than the area of the back surface 113. The molding compound 130 encapsulates the chip 110 and the thermally conductive element 120 and has the upper surface 132 and the lower surface 134 opposite to each other. The top surface 122 of the thermally conductive element 120 is aligned with the upper surface 132 of the molding compound 130. The bottom surface 115 of the electrodes 112 of the chip 110 is aligned with the lower surface 134 of the molding compound 130. The redistribution layer 170 is disposed on the lower surface 134 of the molding compound 130 and electrically connected to the electrodes 112 of the chip 110.

Furthermore, the chip package structure 100a of the present embodiment further includes the conductive through holes 140, the first pads 150, and the second pads 155. The conductive through holes 140 penetrate the molding compound 130 and are connected to the upper surface 132 and the lower surface 134. The first pads 150 are disposed on the upper surface 132 of the molding compound 130 and electrically connected to the first end 142 of each of the conductive through holes 140. The second pads 155 are disposed on the lower surface 134 of the molding compound 130 and electrically connected to the second end 144 of each of the conductive through holes 140, wherein the patterned circuit layer 172 of the redistribution layer 170 is electrically connected to the second pads 155.

In addition, the chip package structure 100a of the present embodiment further includes the antenna structure layer 160 disposed on the upper surface 132 of the molding compound 130 and including the dielectric layer 162 and the antenna patterns 164. The dielectric layer 162 has the opening 163 exposing the thermally conductive element 120, and the dielectric layer 162 covers the upper surface 132 of the molding compound 130 and the first pads 150. The antenna patterns 164 are embedded in the dielectric layer 162 and aligned with the surface 165 of the dielectric layer 162 that is relatively far from the molding compound 130, and the antenna patterns 164 are electrically connected to the first pads 150. In addition, the chip package structure 100a of the present embodiment further includes the solder balls 180 disposed on the fan-out pads 174 of the redistribution layer 170 and electrically connected to the redistribution layer 170.

Compared with the conventional manufacturing method in which the active surface of the chip is faced up, the chip 110 and the thermally conductive element 120 thereon are bonded on the adhesive layer 12 of the carrier 10 with the active surface 111 faced down and the thermally conductive element 120 is disposed on the back surface 113 of the chip 110, wherein the molding compound 130 and the opening 163 of the dielectric layer 162 of the antenna structure layer 160 both expose the top surface 122 of the thermally conductive element 120. Thereby, the heat generated by the chip 110 may be quickly transferred to the outside via the thermally conductive element 120, so that the chip package structure 100a of the present embodiment may have a better heat dissipation effect. In addition, the redistribution layer 170 is disposed on the lower surface 134 of the molding compound 130 and electrically connected to the electrodes 112 of the chip 110, and the conductive through holes 140, the first pads 150, and the second pads 155 are electrically connected to the antenna structure layer 160 and the redistribution layer 170 such that the chip package structure 100a of the present embodiment may have better electrical performance. In short, the chip package structure 100a of the present embodiment may simultaneously have good electrical performance and heat dissipation performance, so that the function of the chip 110 may be maintained normally without overheating, and the radiation intensity and gain of the antenna patterns 164 may be maintained, thereby effectively extending the service life of the chip package structure 100a. In other words, the chip package structure 100a of this embodiment can be regarded as a chip package structure with a thermal enhanced fan-out antenna-in-package.

It should be mentioned here that, the following embodiments adopt the reference numerals of the embodiments above and a portion of the content thereof, wherein the same reference numerals are used to represent the same or similar devices and descriptions of the same technical content are omitted. The omitted portions are as described in the embodiments above and are not repeated in the embodiments below.

Figure 3:
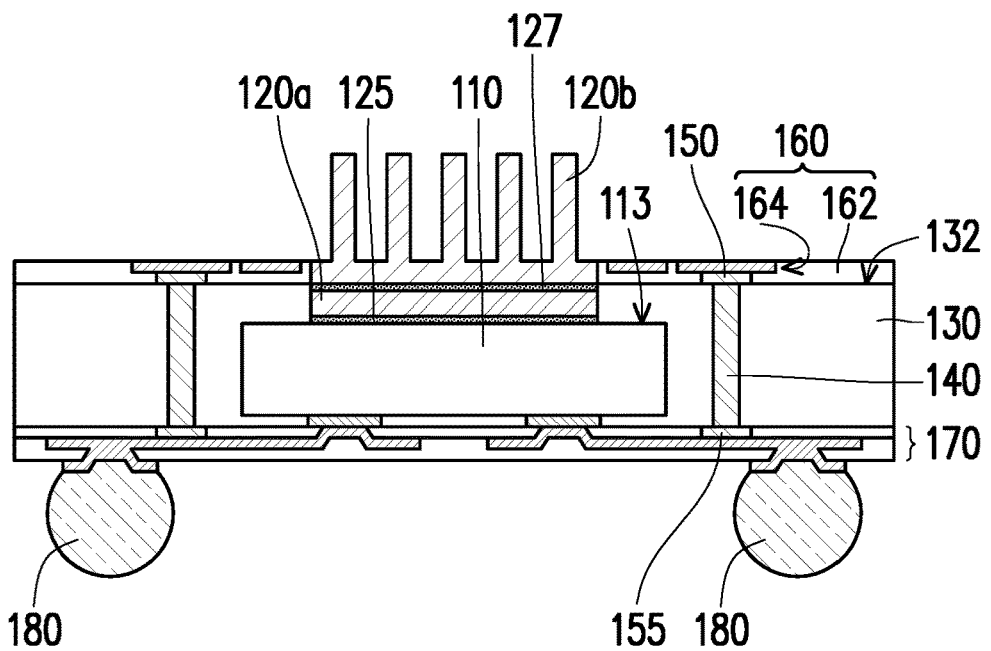
FIG. 3 is a cross-sectional view of a chip package structure of an embodiment of the invention.

FIG. 3 is a cross-sectional view of a chip package structure of an embodiment of the invention. Please refer to FIG. 1J and FIG. 3 at the same time. A chip package structure 100b of the present embodiment is similar to the chip package structure 100a of FIG. 1J and the difference between the two is that the thermally conductive element of the present embodiment includes a first thermally conductive element 120a and a second thermally conductive element 120b. The first thermally conductive element 120a is fixed on the back surface 113 of the chip 110 via the thermal interface material 125, wherein the first thermally conductive element 120a is, for example, a heat sink. The second thermally conductive element 120b is fixed on the first thermally conductive element 120a via the thermal interface material 127, wherein the second thermally conductive element 120b is, for example, a cooling fin. Herein, the first thermally conductive element 120a is located between the thermal interface material 125 and the thermal interface material 127, and the thermal interface material 127 and the upper surface 132 of the molding compound 130 are coplanar, but the invention is not limited thereto. Since the chip package structure 100b of the present embodiment includes the first thermally conductive element 120a and the second thermally conductive element 120b, the chip package structure 100b may be used on a high-performance chip 110, thereby improving the heat dissipation effect of the overall chip package structure 100b.

Figure 4:
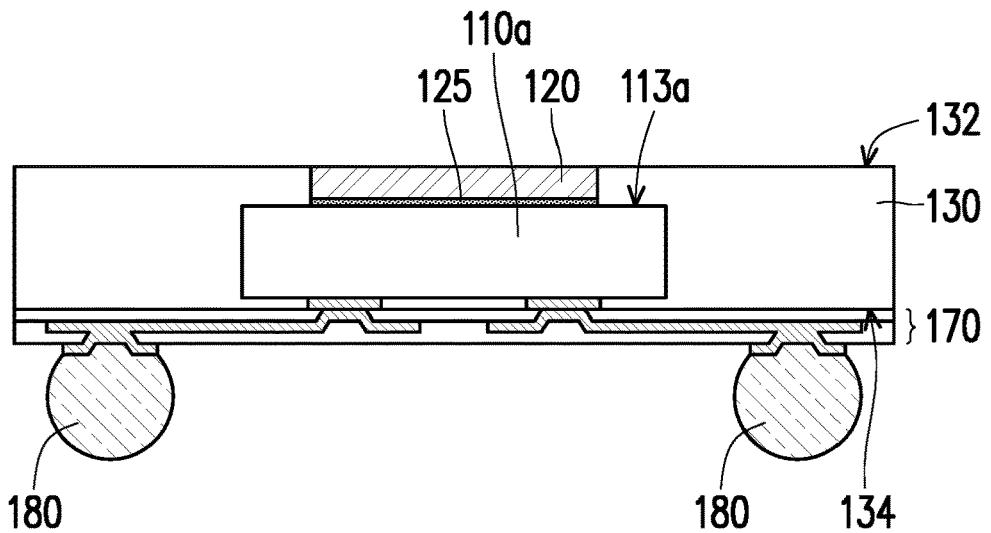
FIG. 4 is a cross-sectional view of a chip package structure of another embodiment of the invention.

FIG. 4 is a cross-sectional view of a chip package structure of another embodiment of the invention. Please refer to FIG. 1J and FIG. 4 at the same time. A chip package structure 100c of the present embodiment is similar to the chip package structure 100a of FIG. 1J, and the difference between the two is that the chip package structure 100c of the present embodiment does not have the antenna structure layer 160, and the chip 110a of the present embodiment is embodied as a baseband chip. The thermally conductive element 120 is disposed on the back surface 113a of the chip 110a.

In the manufacturing process, after the step of FIG. 1F, that is, after the carrier 10 and the adhesive layer 12 are removed and the electrodes 112 of the chip 110 and the lower surface 134 of the molding compound 130 opposite to the upper surface 132 are exposed, the steps of FIG. 1J is immediately performed, i.e., steps such as forming the redistribution layer 170 on the lower surface 134 of the molding compound 130, forming the solder balls 180 on the fan-out pads 174 of the redistribution layer 170, and performing the singulation process.

Figure 5:
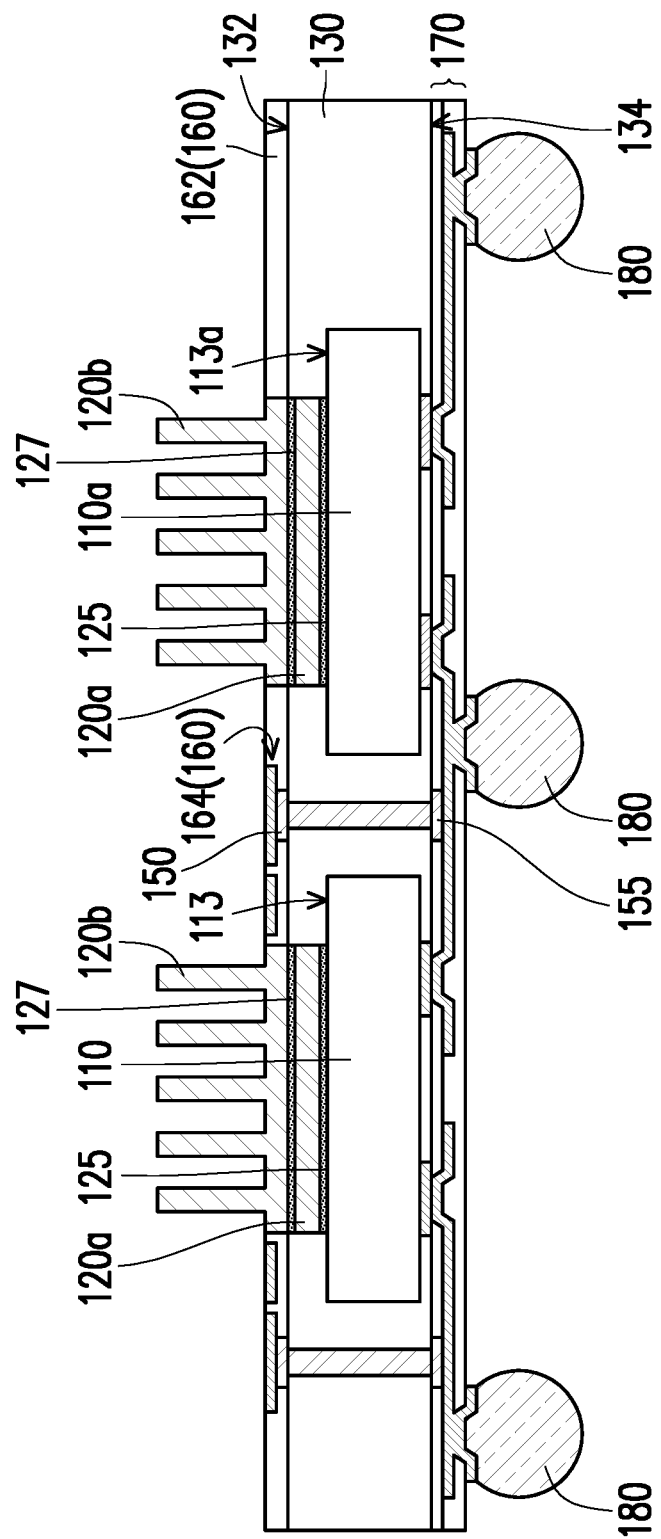
FIG. 5 is a cross-sectional view of a chip package structure of yet another embodiment of the invention.

FIG. 5 is a cross-sectional view of a chip package structure of yet another embodiment of the invention. Please refer to FIG. 1J and FIG. 5 at the same time. A chip package structure 100d of the present embodiment is similar to the chip package structure 100a of FIG. 1J and the difference between the two is that the at least one chip of the present embodiment includes the chip 110 (may be regarded as the first chip) and the chip 110a (may be regarded as the second chip). The antenna patterns 164 are disposed corresponding to the chip 110. For example, the antenna patterns 164 are disposed around the periphery of the chip 110. Alternatively, an orthographic projection of the antenna patterns 164 on the upper surface 132 of the molding compound 130 is completely or partially overlapped with an orthographic projection of the chip 110 on the upper surface 132 of the molding compound 130. An orthographic projection of the antenna patterns 164 on the upper surface 132 of the molding compound 130 is not overlapped with an orthographic projection of the chip 110a on the upper surface 132 of the molding compound 130. Herein, the chip 110 is a radio frequency chip, and the chip 110a is a baseband chip. That is, the antenna patterns 164 are not provided at the location corresponding to the baseband chip.

In addition, the thermally conductive element of the present embodiment includes first thermally conductive elements 120a and second thermally conductive elements 120b. The first thermally conductive elements 120a are fixed on the back surfaces 113, 113a of the chips 110, 110a via the thermal interface materials 125, wherein each of the first thermally conductive elements 120a is, for example, a heat sink. The second thermally conductive elements 120b are fixed on the first thermally conductive elements 120a respectively via the thermal interface materials 127, wherein each of the second thermally conductive elements 120b is, for example, a cooling fin. Herein, the first thermally conductive elements 120a are located between the thermal interface materials 125 and the thermal interface materials 127, and the thermal interface materials 127 and the upper surface 132 of the molding compound 130 are coplanar, but the invention is not limited thereto. Since the chip package structure 100d of the present embodiment includes the first thermally conductive elements 120a and the second thermally conductive elements 120b, the chip package structure 100d may be used on the high-performance chips 110, 110a, thereby improving the heat dissipation effect of the overall chip package structure 100d.

Based on the above, in the design of the chip package structure of the invention, the thermally conductive element is disposed on the back surface of the chip, and the top surface of the thermally conductive element is exposed by the molding compound. Thereby, the heat generated by the chip may be quickly transferred to the outside via the thermally conductive element, so that the chip package structure of the invention may have a better heat dissipation effect. In addition, the redistribution layer is disposed on the lower surface of the molding compound and is electrically connected to the electrodes of the chip, so that the chip package structure of the invention may have better electrical performance. In short, the chip package structure of the invention may simultaneously have good electrical performance and heat dissipation performance, so that the function of the chip may be maintained normally without overheating, thereby effectively extending the service life of the chip package structure.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a chip package structure, comprising:
    providing a carrier with an adhesive layer formed;
    providing at least one chip and at least one thermally conductive element, wherein the respective chip has an active surface and a back surface opposite to each other and a plurality of electrodes disposed on the active surface, and the respective thermally conductive element is disposed on the back surface of the respective chip;
    bonding the at least one chip on the carrier, wherein the electrodes of the respective chip are directly in contact with the adhesive layer;
    forming a molding compound on the carrier to cover the adhesive layer and encapsulate the at least one chip and the at least one thermally conductive element;
    removing a portion of the molding compound such that the molding compound exposes a top surface of the respective thermally conductive element;
    removing the carrier and the adhesive layer to expose the electrodes of the respective chip and a lower surface of the molding compound, wherein a bottom surface of each of the electrodes of the respective chip is aligned with the lower surface of the molding compound; and
    forming a redistribution layer on the lower surface of the molding compound, wherein the redistribution layer is electrically connected to the electrodes of the respective chip.

2. The manufacturing method of the chip package structure of claim 1, further comprising, after removing the carrier and the adhesive layer and before forming the redistribution layer:
    forming at least one conductive through hole to penetrate the molding compound and connect an upper surface of the molding compound opposite to the lower surface and the lower surface;
    forming at least one first pad on the upper surface of the molding compound, wherein the at least one first pad is electrically connected to a first end of the respective conductive through hole; and
    forming at least one second pad on the lower surface of the molding compound, wherein the at least one second pad is electrically connected to a second end of the respective conductive through hole.

3. The manufacturing method of the chip package structure of claim 2, further comprising, before forming the redistribution layer:
    forming an antenna structure layer on the upper surface of the molding compound, wherein the antenna structure layer comprises a dielectric layer and a plurality of antenna patterns, the dielectric layer has at least one opening exposing the at least one thermally conductive element, the dielectric layer covers the upper surface of the molding compound and the at least one first pad, the antenna patterns are embedded in the dielectric layer and aligned with a surface of the dielectric layer that is relatively far from the molding compound, and the antenna patterns are electrically connected to the at least one first pad.

4. The manufacturing method of the chip package structure of claim 3, wherein the at least one chip is at least one radio frequency chip.

5. The manufacturing method of the chip package structure of claim 3, wherein the at least one chip comprises a first chip and a second chip, and the antenna patterns are disposed corresponding to the first chip.

6. The manufacturing method of the chip package structure of claim 5, wherein the first chip is a radio frequency chip and the second chip is a baseband chip.

7. The manufacturing method of the chip package structure of claim 1, wherein the at least one chip is at least one baseband chip.

8. The manufacturing method of the chip package structure of claim 1, further comprising, after forming the redistribution layer:
    forming a plurality of solder balls on a plurality of fan-out pads of the redistribution layer, wherein the solder balls are electrically connected to the redistribution layer.

9. The manufacturing method of the chip package structure of claim 1, wherein an orthographic projection area of the respective thermally conductive element on the back surface of the respective chip is smaller than an area of the back surface.

10. The manufacturing method of the chip package structure of claim 1, further comprising:
    providing at least one thermal interface material between the at least one thermally conductive element and the at least one chip, wherein the at least one thermally conductive element is fixed on the at least one chip via the at least one thermal interface material.

* * * * *